United States Patent [19]

Wilson

[11] 4,356,451

[45] Oct. 26, 1982

[54] ACTIVE BAND PASS FILTER

[76] Inventor: Harold E. Wilson, PSC Box 253, APO, Miami, Fla. 34002

[21] Appl. No.: 159,805

[22] Filed: Jun. 16, 1980

[51] Int. Cl.$^3$ .............................................. H03F 1/34
[52] U.S. Cl. ..................................... 330/107; 330/109
[58] Field of Search ........................ 330/107, 109, 294

[56] References Cited

U.S. PATENT DOCUMENTS

| 3,946,328 | 3/1976 | Boctor | 330/107 |
| 3,955,150 | 5/1976 | Soderstrand | 330/103 |
| 3,972,006 | 7/1976 | Ruegg | 330/107 |
| 3,993,959 | 11/1976 | Boctor | 330/109 |
| 4,015,224 | 3/1977 | Benzinger | 330/107 X |
| 4,050,023 | 9/1977 | Edgar | 328/127 |

OTHER PUBLICATIONS

Sierra, "Active Filters Without Inductors", *IBM Technical Disclosure Bulletin*, vol. 15, No. 6, Nov. 1972, pp. 1788, 1789.

*Primary Examiner*—James B. Mullins
*Attorney, Agent, or Firm*—Gifford, VanOphem, Sheridan & Sprinkle

[57] ABSTRACT

An active band pass filter is provided in which the band pass or resonant frequency can be varied. The band pass filter comprises a differential amplifier having a pair of input resistors wherein the input signal is fed through both input resistors and to both the inverting and noninverting inputs of the differential amplifier. Second order feedback to the inverting input is provided through an RC parallel combination while a capacitor provides differential feedback to the noninverting input of the differential amplifier. A variable resistor is electrically connected between the non-inverting input and ground and is used to vary the pass band or resonant frequency of the band pass filter.

7 Claims, 2 Drawing Figures

ACTIVE BAND PASS FILTER

BACKGROUND OF THE INVENTION

I. Field of the Invention

The present invention relates generally to band pass filters and, more particularly, an active band pass filter.

II. Description of the Prior Art

The previously known band pass filters typically comprise passive circuit elements having an input terminal, an output terminal, and a common or ground terminal extending between the input and output. In operation, these previously known band pass filters permit an input signal within a certain predetermined pass band frequency range to pass from the input terminal and to the output terminal generally unattenuated. However, frequencies falling outside the pass band frequency range are attenuated with the degree of attenuation usually increasing with the frequency deviation from the pass band frequency range.

These previously known passive band pass filters, however, are disadvantageous for a number of different reasons. One disadvantage of the previously known passive band pass filters is that the pass band frequency is preset and nonadjustable. Consequently, the band pass must be specifically designed for the circuit application. Moreover, the circuit application must be limited to a preset and, therefore, nonadjustable pass band frequency range.

There are also a number of previously known band pass filters utilizing an active component, typically a differential amplifier. These previously active band pass filters, however, are disadvantageous in that, as before, the pass band frequency range is preset and, therefore, nonadjustable or when adjustable require high precision in matched components for tracking in ganged control either resistive or capacitive or both. Furthermore, the previously known active band pass filters are unduly complex and require a multiplicity of circuit elements.

A still further disadvantage of these previously known active band pass filters is that these filters are only capable of preducing a band pass having a relatively large shape factor and, thus, are unsuitable for many circuit applications.

SUMMARY OF THE PRESENT INVENTION

The present invention provides an active band pass filter in which the pass band frequency range can be varied as desired and which also exhibits a low shape factor.

In brief, the band pass filter of the present invention comprises an input terminal, output terminal and a common terminal. In many applications, the common terminal is also grounded.

The band pass filter of the present invention utilizes a differential amplifier having an inverting and noninverting input as the active element. The input signal to the band pass filter is applied to the input and common terminal while the band pass filter output is measured between the output terminal and the common terminal.

The input terminal is coupled through two input resistors to both the inverting and noninverting inputs of the differential amplifier. The output of the differential amplifier is directly connected to the output terminal.

A resistor and capacitor parallel combination are electrically connected between the differential amplifier inverting input and the output terminal. This RC parallel combination provides second order feedback to the differential amplifier inverting input and the resistor function is primarily to prevent the output voltage from going to the upper or lower limits of the active component from offset voltage or currents. Similarly, a capacitor is directly connected between the differential amplifier output and the differential amplifier noninverting input which likewise provides second order feedback to the noninverting input.

Lastly, a variable resistor is electrically connected between the differential amplifier noninverting input and the common terminal. This variable resistor creates a phase shift at the noninverting input from the feedback and stabilizes the circuit.

In addition to stabilization, the variable resistor controls the resonant frequency of the band pass filter in accordance with the impedance of the variable resistor and the capacitor between the differential amplifier output and noninverting input. This resonant frequency, of course, can be varied by varying the resistor value of the variable resistor or capacitors. A single variable resistor is used. Varying the resonant frequency of the band pass filter, likewise, varies the pass band frequency range in the desired fashion.

BRIEF DESCRIPTION OF THE DRAWING

A better understanding of the present invention will be had upon reference to the following detailed description when read in conjunction with the accompanying drawings, wherein like reference characters refer to like parts throughout the several views, and in which.

DETAILED DESCRIPTION OF A PREFERRED EMBODIMENT OF THE PRESENT INVENTION

Figure 1:
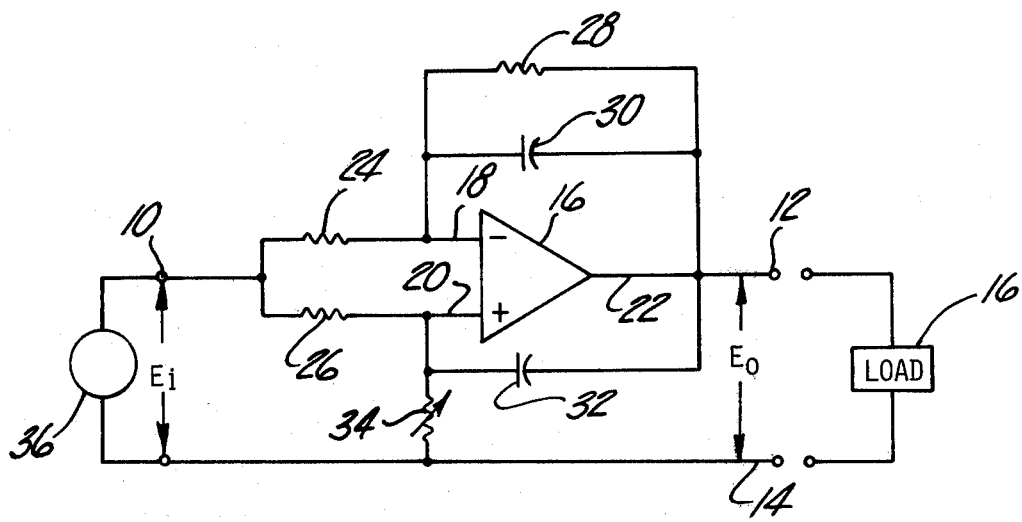
FIG. 1 is a schematic view illustrating the active band pass filter according to the present invention.

With reference first to FIG. 1, a schematic diagram of the band pass filter according to the present invention is thereshown and comprises an input terminal 10, an output terminal 12 and a common terminal 14 which may also be the circuit ground. An input voltage source 36 is electrically connected between the input terminal 10 and common terminal 14 while a resistive load 16 is electrically connected between the output terminal 12 and common terminal 14. In the conventional fashion, the gain of the band pass filter is equal to the output voltage $E_o$, i.e., the voltage between the output terminal 12 and common terminal 14, divided by the input voltage $E_i$, i.e., the voltage between the input terminal 10 and the common terminal 14.

The band pass filter according to the present invention further comprises a differential amplifier 16 having an inverting input 18, a noninverting input 20 and an output 22. The differential amplifier 16 is an active element and, as such, requires a power supply (not shown) in order to operate.

A first input resistor 24 is connected in series between the input terminal 10 and the differential amplifier inverting input 18. Similarly, a second input resistor 26 is connected in series between input terminal 10 and the differential amplifier noninverting input 20 and the resistors 24 and 26 are of substantially the same resistive value. The output 22 of the differential amplifier 16 is directly electrically connected to the output terminal 12.

A feedback resistor 28 is connected in parallel with a first feedback capacitor 30 and this RC parallel combination is electrically connected between the differential amplifier output 22 and the differential amplifier inverting input 18. Similarly, the second feedback capacitor 32 is electrically connected between the differential amplifier output 22 and its noninverting input 20. The capacitors 30 and 32 are of substantially the same capacitive value while the resistor 28 has substantially the same resistive value as the resistors 24 and 26. Furthermore, the capacitors 30 and 32 do not effect the DC or steady state gain of the differential amplifier 16 but rather are only functionally operational when there is a changing voltage input from the voltage source 36. As such, the feedback capacitor 32 and 30 provide second order differential feedback to both the differential amplifier inverting and noninverting inputs 18 and 20, respectively.

With the circuit as thus far described and assuming a varying voltage input, the feedback capacitors 30 and 32 provide a feedback in phase with the output which causes the circuit to oscillate and the circuit is unstable. To rectify this, a variable resistor 34 is electrically connected between the noninverting input of the differential amplifier 16 and the common terminal 14. This variable resistor 34 provides a phase shift at the noninverting input of the differential amplifier 16 and renders the circuit stable. In addition, the variable resistor 34 controls the resonant frequency of the circuit in view of the RC time constant as will subsequently be described in greater detail.

In operation, the input signal from the voltage source 36 to the input terminal 10 encounters a dividing net work between the resistor 26 and variable resistor 34 so that only a portion of this input signal is applied to the noninverting input 20. Moreover, since the resistor 28 is substantially equal in value to resistor 24, the amplifier at common mode has a unity gain in the well known fashion. Moreover, due to the servo action of the differential amplifier 16 with the feedback resistor 28, the differential amplifier output 22 follows the input.

The second order feedback from the differential amplifier 22 through the capacitor 32 is added vectorily to the voltage signal at the differential amplifier noninverting input 20. When these two signals are in phase the differential amplifier output 22 provides all current through the variable resistor 34 thus equalizing the voltage at both differential amplifier inputs 18 and 20 and simultaneously attaining a unity gain at the particular input frequency. When a unity gain or regeneration has been established in this manner, the differential amplifier 16 is oscillating at the input frequency and is also at resonance and the output signal from the differential amplifier 16 is at a maximum. Conversely, signals at frequencies other than the resonant frequency are greatly attenuated by the circuit of the present invention even if such signals simultaneously appear on the input terminal 10.

At the resonant frequency, the input impedance to the band pass filter of the present invention approaches infinity due to the feedback to the differential amplifier inverting input 18. At frequencies other than the resonant frequency, the input impedance cannot be less than the value of the resistance of 24 and 26 in parallel. Typically values of one megohm are employed for the resistors 24 and 26 so that a very high input impedance (0.5 megohm) is established even outside the resonant frequency of the circuit.

Figure 2:
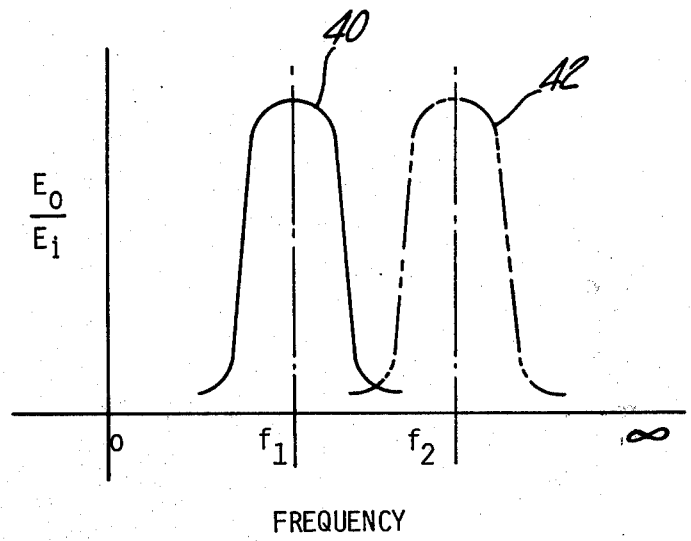
FIG. 2 is a graph of the gain versus frequency of the band pass filter of the present invention.

With reference now to FIG. 2, a gain versus frequency graph is illustrated for the band pass filter of the present invention. As is shown at 40, the frequency pass band at the resident frequency f1 exhibits an excellent shape factor and has substantially a unity gain at the resident frequency f1. Conversely, at frequencies other than the resident frequency f1, the gain of the band pass filter is greatly attenuated and approaches zero.

Still referring to FIG. 2, the adjustment of the variable resistor 34 varies the pass band of the band pass filter as shown in the phanton lines at 42 which has a resonant frequency of f2. Still different resonant frequencies for the band pass filters of the present invention can be established by merely readjusting the variable resistor 34.

From the foregoing, it can be seen that the active band pass filter according to the present invention provides a band pass filter utilizing a minimum of inexpensive and readily available circuit elements and in which the resonant frequency can be simply and easily varied. Furthermore, the band pass filter according to the present invention enjoys an excellent shape factor.

Having described my invention, however, many modifications thereto will become apparent to those skilled in the art to which it pertains without deviation from the spirit of the invention as defined by the scope of the appended claims.

I claim:

1. An active band pass filter comprising:
an input terminal, an output terminal and a common terminal,
a differential amplifier having an inverting input and a noninverting input,
means for electrically connecting said input terminal to both said inverting and noninverting inputs,
frequency dependent feedback means for electrically connecting the output terminal to both said inverting and noninverting inputs so that said amplifier attains a predetermined gain at a resonant frequency and a lesser gain at other frequencies,
wherein said feedback means comprises a first capacitor electrically connected between said output terminal and said inverting input and a second capacitor electrically connected between said output terminal and said noninverting input and
wherein only said noninverting input of said differential amplifier is connected to said common terminal through a resistor, and
wherein the resonant frequency of the amplifier varies in accordance with the value of said resistor.

2. The invention as defined in claim 1 wherein said feedback means comprises a first capacitor electrically connected between said output terminal and said inverting input and a second capacitor electrically connected between said output terminal and said noninverting input.

3. The invention as defined in claim 2 wherein said capacitors are of substantially the same capacitive value.

4. The invention as defined in claim 2 wherein said frequency varying means comprises a variable resistor electrically connected between said common terminal and said noninverting input.

5. The invention as defined in claim 1 and further comprising a second resistor electrically connected between said input terminal and said noninverting input, and a third resistor electrically connected between said input terminal and said inverting input.

6. The invention as defined in claim 5 wherein all of said resistors have substantially the same resistive value.

7. The invention as defined in claim 2 and further comprising a second resistor electrically connected between said output terminal and said inverting input.

* * * * *